US 8,526,196 B2

(12) United States Patent
Eichner et al.

(10) Patent No.: US 8,526,196 B2
(45) Date of Patent: Sep. 3, 2013

(54) METHOD FOR RECEIVING AN ELECTRIC/ELECTRONIC COMPONENT AND CORRESPONDING MOUNTING METHOD AND COVERING FOR SAID TYPE OF DEVICE

(75) Inventors: Markus Eichner, Nuremberg (DE); Thomas Uhland, Weiler (DE)

(73) Assignee: KNORR-BREMSE Systeme fuer Nutzfahrzeuge GmbH, Munich (DE)

( * ) Notice: Subject to any disclaimer, the term of this patent is extended or adjusted under 35 U.S.C. 154(b) by 304 days.

(21) Appl. No.: 12/859,947

(22) Filed: Aug. 20, 2010

(65) Prior Publication Data

US 2010/0315798 A1 Dec. 16, 2010

Related U.S. Application Data

(63) Continuation of application No. PCT/EP2009/000937, filed on Feb. 11, 2009.

(30) Foreign Application Priority Data

Feb. 20, 2008 (DE) .................. 10 2008 009 947

(51) Int. Cl.
*H05K 7/02* (2006.01)

(52) U.S. Cl.
USPC .......... 361/807; 361/704; 361/749; 174/50.5; 174/50.54; 174/564; 439/67; 439/147; 439/164; 439/189; 439/320; 439/404; 277/650; 250/370.09; 340/286.07; 340/384.1

(58) Field of Classification Search
USPC ............. 361/807, 704, 749; 174/50.5, 50.54, 174/564; 439/67, 76, 78, 147, 164, 289, 439/320, 404; 250/370.09; 340/286.07, 340/384.1; 277/650
See application file for complete search history.

(56) References Cited

U.S. PATENT DOCUMENTS

| 5,608,592 A | * | 3/1997 | Mizoshita et al. | ......... 360/256.2 |
| 5,846,097 A | * | 12/1998 | Marian, Jr. | ................ 439/289 |
| 5,880,904 A | * | 3/1999 | Mizoshita et al. | ......... 360/97.16 |
| 6,025,973 A | * | 2/2000 | Mizoshita et al. | ......... 360/98.08 |
| 6,059,591 A | * | 5/2000 | Bolen et al. | ................... 439/164 |
| 6,179,627 B1 | * | 1/2001 | Daly et al. | ................... 439/76.1 |
| 6,203,333 B1 | * | 3/2001 | Medina et al. | ............... 439/76.1 |

(Continued)

FOREIGN PATENT DOCUMENTS

| DE | 195 41 925 A1 | 5/1997 |
| EP | 0 632 532 A2 | 1/1995 |
| EP | 1 622 438 A2 | 2/2006 |
| EP | 1 867 874 A1 | 12/2007 |

OTHER PUBLICATIONS

International Search Report dated May 27, 2009 with English translation (six (6) pages).

*Primary Examiner* — Xiaoliang Chen
(74) *Attorney, Agent, or Firm* — Crowell & Moring LLP

(57) ABSTRACT

An apparatus is provided for receiving, at least partially, an electric/electronic component in an internal housing area, in particular for commercial vehicles. A first housing component at least partially forms the internal housing area and a cover at least partially surrounds the internal housing area. The cover is designed such that at least one electrically conductive connecting element for electrically coupling the electric/electronic component to at least one additional electric/electronic component provided outside of the internal housing area is fixed by the cover. A method for assembling the apparatus is also provided.

13 Claims, 2 Drawing Sheets

(56) References Cited

U.S. PATENT DOCUMENTS

| | | | |
|---|---|---|---|
| 6,396,694 B1* | 5/2002 | van den Berg | 361/704 |
| 6,409,532 B2* | 6/2002 | Payson et al. | 439/320 |
| 7,392,806 B2* | 7/2008 | Yuen et al. | 128/205.27 |
| 7,482,595 B1* | 1/2009 | Ertel | 250/370.09 |
| 2001/0053624 A1* | 12/2001 | Medina et al. | 439/404 |
| 2002/0001984 A1* | 1/2002 | Franzen et al. | 439/78 |
| 2002/0047330 A1* | 4/2002 | Martin | 310/43 |
| 2002/0186123 A1* | 12/2002 | Kivisto et al. | 340/286.07 |
| 2003/0112315 A1* | 6/2003 | Hetzer et al. | 347/108 |
| 2003/0114022 A1* | 6/2003 | Franzen et al. | 439/67 |
| 2004/0257206 A1* | 12/2004 | Kivisto et al. | 340/384.1 |
| 2009/0020962 A1* | 1/2009 | Shinoda et al. | 277/650 |
| 2009/0266573 A1* | 10/2009 | Engmark et al. | 174/50.54 |
| 2010/0002403 A1* | 1/2010 | Loibl et al. | 361/749 |
| 2010/0015826 A1* | 1/2010 | Daily et al. | 439/147 |
| 2010/0067202 A1* | 3/2010 | Loibl et al. | 361/749 |
| 2010/0089638 A1* | 4/2010 | Shinoda et al. | 174/564 |
| 2011/0090652 A1* | 4/2011 | Wee et al. | 361/749 |
| 2011/0209890 A1* | 9/2011 | Yamaguchi et al. | 174/50.5 |

* cited by examiner

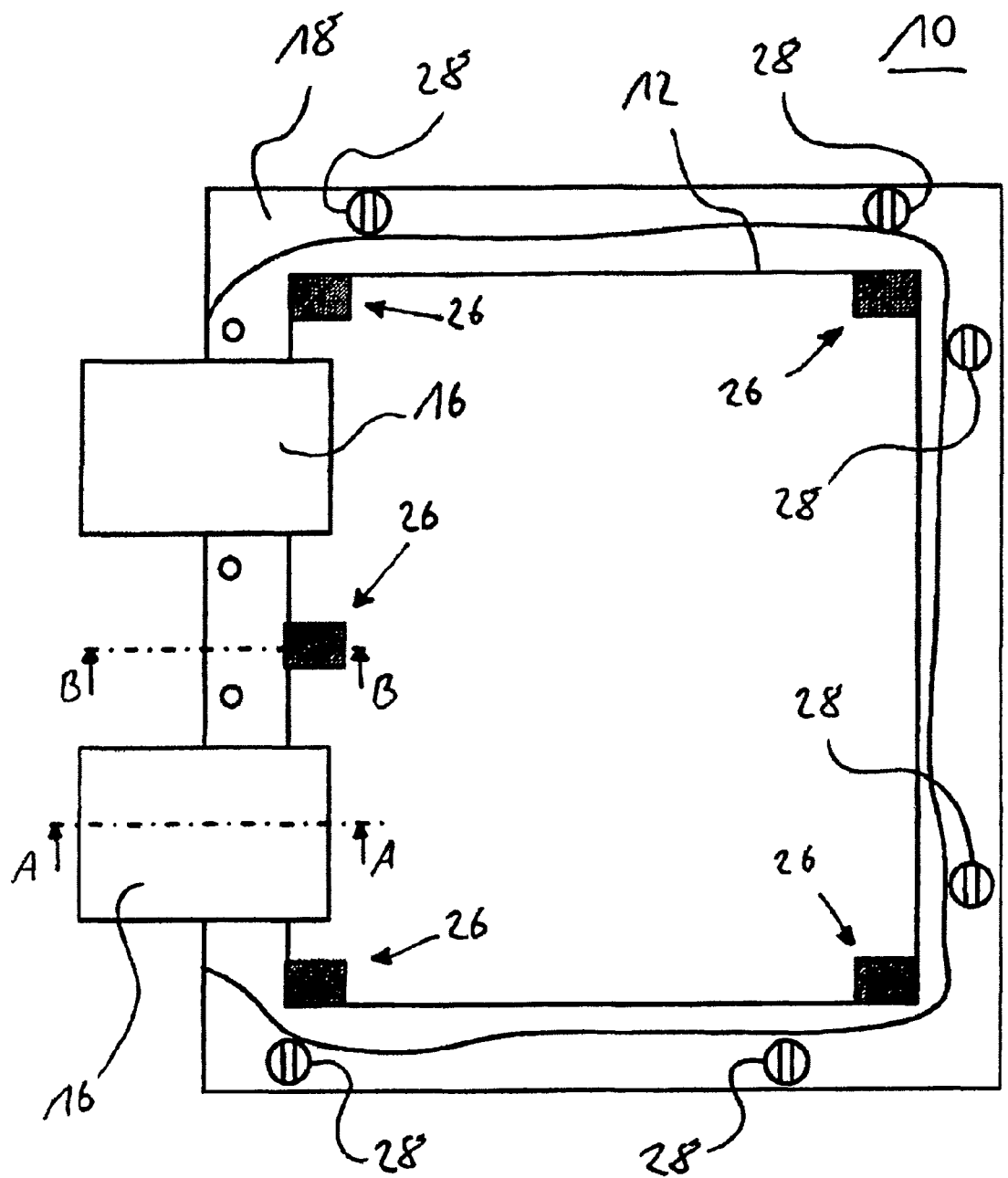

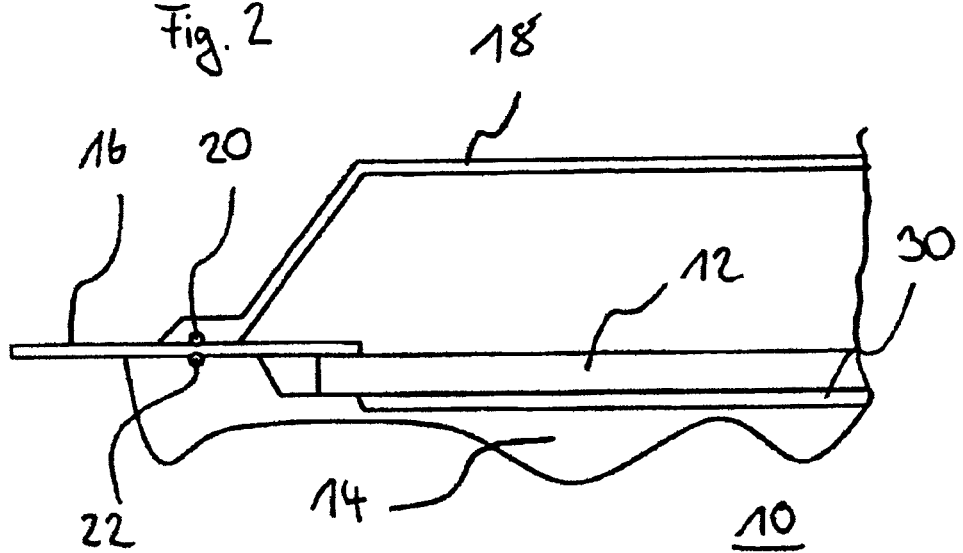
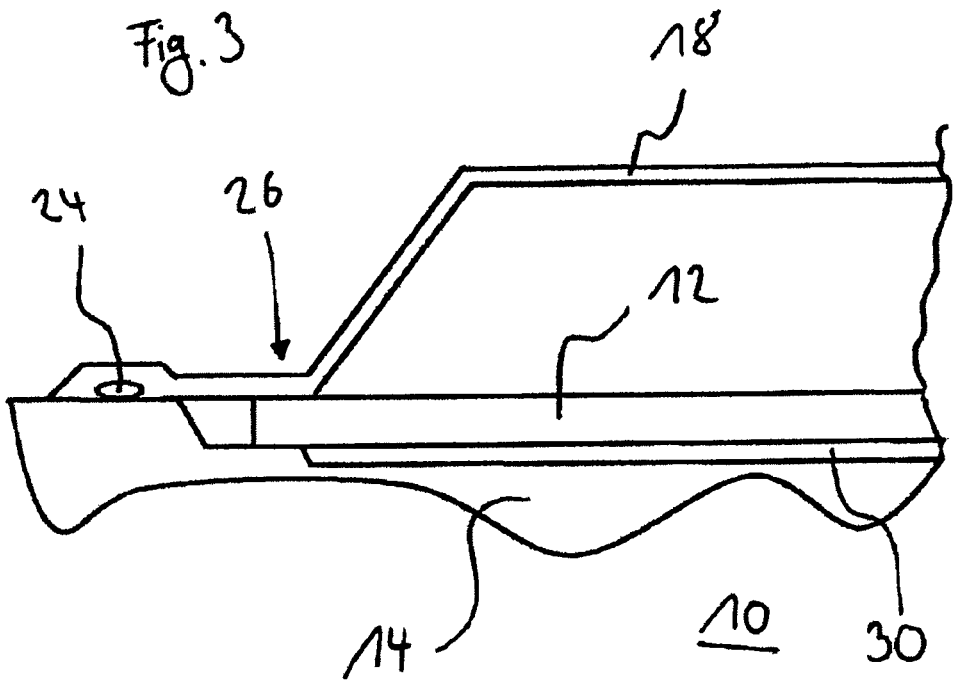

METHOD FOR RECEIVING AN ELECTRIC/ELECTRONIC COMPONENT AND CORRESPONDING MOUNTING METHOD AND COVERING FOR SAID TYPE OF DEVICE

CROSS-REFERENCE TO RELATED APPLICATIONS

This application is a continuation of PCT International Application No. PCT/EP2009/000937, filed Feb. 11, 2009, which claims priority under 35 U.S.C. §119 from German Patent Application No. DE 10 2008 009 947.3, filed Feb. 20, 2008, the entire disclosures of which are herein expressly incorporated by reference.

BACKGROUND AND SUMMARY OF THE INVENTION

The invention relates to an apparatus for at least partially holding at least one electrical/electronic component in an internal area of a housing, in particular for commercial vehicles, having at least one housing component which at least partially forms the housing internal area, and having a cover which at least partially closes the housing internal area.

The invention also relates to a method for assembling this type of apparatus.

Furthermore, the invention relates to a cover for an apparatus for at least partially holding at least one electrical/electronic component in a housing internal area, in particular for commercial vehicles, wherein the cover can be coupled to at least one housing component, which at least partially forms the housing internal area, and the housing internal area can be at least partially closed by the cover.

Normally, apparatuses such as these which belong to the prior art are used, for example, in conjunction with controllers in commercial vehicles. By way of example, such controllers include, inter alfa, electrically conductive connecting elements, in particular flexible printed circuits, via which the electrical and/or electronic components of the controller which are held in a housing internal area can be electrically conductively coupled to electrical and/or electronic components which are arranged outside the housing internal area, for example to further controllers. An interface must be provided in order to couple the flexible printed circuit to the electrical/electronic components which are held in the housing internal area, or to a component which includes these items and which, for example, may be in the form of a rigid or fixed printed circuit board. This interface is normally provided by plug connectors, that is to say by providing a plug on the flexible printed circuit and a corresponding mating plug on the rigid printed circuit board, or by thermode soldering, that is to say by soldering the flexible printed circuit to the rigid printed circuit board. In the end, this makes it possible to produce an electrically conductive connection between electronics provided on the rigid printed circuit board and further electrical/electronic components within the commercial vehicle, via the flexible printed circuit.

In the field of operation of commercial vehicles, stringent requirements must be complied with relating to the vibration resistance and life of all components, in particular of the electrical/electronic components of the controller. For this reason, by way of example, the flexible printed circuits are fixed to certain points on the controller. One option for fixing the flexible printed circuit is achieved, for example, by additionally fixing or holding the flexible printed circuit via the plug connector by us of clamping elements which are additionally provided thereon. A further option is to provide further additional fixing components, for example on the fixed or rigid printed circuit board, via which exclusively the flexible printed circuit can be fixed. The rigid or fixed printed circuit board is normally attached to a housing component of the controller and is generally covered by a cover or cover shroud for protection, in particular for direct-contact protection. Particularly while the flexible printed circuit is being fitted, for example when the flexible printed circuit is being passed through under or through the cover shroud, no seal is generally provided. However, extruded seals or intermediate seals can preferably be used subsequently for sealing purposes, and are used to seal the intermediate spaces between the flexible printed circuit and the cover/the housing component. The measures known from the prior art for achieving specific vibration resistance and to comply with the sealing requirements are, however, extremely complex and are therefore highly costly.

There is therefore needed apparatuses, covers and assembly methods of the generic type by which it is possible to overcome the abovementioned disadvantages, at least partially, in a particularly cost-effective manner.

The apparatus according to the invention for at least partially holding at least one electrical/electronic component builds on the prior art of this generic type. The cover is designed such that at least one electrically conductive connecting element for electrical coupling of the electrical/electronic component to at least one further electrical/electronic component, which is provided outside the housing internal area, is fixed by the cover. The electrically conductive connecting element is preferably in the form of a flexible printed circuit, an insert-molded stamped grid or cable, in particular a flat ribbon cable, and is fixed by the cover or by the cover shroud. The cover or the cover shroud therefore not only provides protection, for example for electronics associated with the electrical/electronic component, but also acts as an attachment element or attachment mechanism for the electrically conductive connecting element.

The apparatus according to the invention can advantageously be developed such that the electrically conductive connecting element is at least partially fixed by at least one edge section of the cover, which is coupled at least in places to at least one edge section of the housing component. The edge sections of the cover are preferably directly coupled to the housing component, for example by a threaded connection, as a result of which, for example, it is possible to adjust the degree of fixing of the electrically conductive connecting element. In particular, the edge sections of the cover, which are used to fix the electrically conductive connecting element, are designed such that a predetermined intermediate space for the electrically conductive connecting element is formed when the cover is screwed to the housing part. For example, the edge section of the cover which is intended for fixing of the connecting element may at least partially be in the form of a recess or a cutout.

Furthermore, the apparatus according to the invention can be implemented such that the electrically conductive connecting element is arranged between the housing component and the cover and, at least in places, touches the housing component and the cover. The interposition of the electrically conductive connecting element allows fixing, for example by clamping, in a particularly simple and cost-effective manner. The electrically conductive connecting element may, however, likewise also be additionally attached to the cover before clamping, for example by adhesive bonding, etc.

Furthermore, the apparatus according to the invention can be designed such that the cover is designed so that it at least partially holds a seal, at least in the area of the fixing of the electrically conductive connecting element. In particular, the cover shroud can be used, for example, to seal electronics of the electronic component which are held in the housing internal area from the environment, and at the same time to ensure fixing and/or attachment of the electrically conductive connecting element passed through the cover. Depending on the respective sealing requirements, an appropriately designed seal is provided in the cover shroud. At the point where the electrically conductive connecting element passes through, leaking can result without such special measures, although this is prevented by the cover according to the invention. For example, the seal, which is in the form of a separate component, can be provided on the cover or on the connecting element, even before the cover is fitted to the housing component. However, alternatively or additionally, the connecting element can also be appropriately insert-molded, in such a way that the insert-molding is alternatively or additionally used for separate sealing from the seal between the cover and the connecting element. A seal is preferably also provided between the connecting element and the housing component, in such a way that essentially two seals are pressed against one another in the area in which the connecting element passes through the cover, specifically above and below the connecting element. Furthermore, it is likewise feasible instead of or in addition to the separate seal, to use a thermally conductive medium as a seal, which is applied in any case between the connecting element and the cover/the housing component, in particular a thermally conductive paste or thermally conductive adhesive which can be dispensed. An extruded "cord" of the thermally conductive material or of the thermally conductive paste can, for example, be used under the connecting element for sealing purposes, while the corresponding separate seal, facing the cover shroud, can be provided above the connecting element.

Furthermore, the apparatus according to the invention can be designed such that the cover holds a seal at least on an edge section which couples the cover to the housing component, such that the edge section at least partially holds the seal and fixes the electrically conductive connecting element. In particular, sections for the seal that is held there are preferably provided in the edge section, in or on which the seal is held, in order to achieve the required seal between the cover and the connecting element. Furthermore, sections are additionally provided which are used to fix the connecting element and are preferably adjacent to the sections for holding the seal.

The apparatus according to the invention can be designed in a particularly advantageous manner in that the electrically conductive connecting element and/or the electrical/electronic component is clamped in in order to fix it between at least one edge section of the housing component and at least one edge section of the cover. The clamping of the electrically conductive connecting element between edge sections of the cover and of the housing component allows the connecting element to be fixed in a particularly cost-effective manner. Furthermore, preferably, the electrical/electronic component can also be clamped in between edge sections of the cover and of the housing component, in order to fix it. The cover, which is provided in particular for fixing the connecting element, is therefore additionally used to fix the electrical/electronic component, which is preferably in the form of a fixed or rigid printed circuit board. The printed circuit board is held via sections of the cover shroud which, for example, are effectively in the form of "sprung arms" by matched design of the nominal dimensions, taking account of appropriate tolerances. The rigid or fixed printed circuit board can also be connected by a screw connection, although this is no longer absolutely essential, because the cover is used for fixing.

Furthermore, the apparatus according to the invention can be implemented such that the housing component and/or the cover touch or touches the electrical/electronic component at least in places, such that heat produced by the electrical/electronic component can be dissipated through the housing component and/or the cover. If, for example, the electronics of the electrical/electronic component produce an unacceptably high power loss, the rigid or fixed printed circuit board can be coupled to a heat sink, for example via a thermally conductive medium, which heat sink is implemented, according to the invention, by the housing component and/or the cover. The thermal contact with the rigid or fixed printed circuit board can therefore instead of this be made by a screw connection or else additionally via the clamping with an appropriate contact force, by the housing component and/or the cover. The cover shroud is therefore additionally used to fix the rigid or fixed printed circuit board, as well as the flexible printed circuit, for heat dissipation as well. Furthermore, a ground connection can also be provided through the contact connection between the housing component and/or the cover and the electrical/electronic component, and this will be described in more detail further below.

The apparatus according to the invention is preferably developed such that the electrical/electronic component which is held in the housing interior is formed by a printed circuit board, in particular a rigid or fixed printed circuit board. For the purposes of this disclosure, the term "rigid or fixed printed circuit boards" means at least printed circuit boards in the form of printed wiring boards, boards or printed circuits (printed wiring board=PWB, printed circuit board=PCB or etched wiring board=EWB), which are used in particular for mechanical attachment, and simultaneous electrical connection, of electrical/electronic components.

Furthermore, the apparatus according to the invention is preferably designed such that the electrically conductive connecting element is formed by a flexible printed circuit, an insertion-molded stamped grid or a cable, in particular a flat ribbon cable.

The apparatus according to the invention is preferably designed such that a ground contact, in particular of the electrical/electronic component to the housing component and/or to the cover, is produced via metalization on the electrical/electronic component. This results, for example, in the production of a ground potential, which may often be the most extensive conductor run on printed circuits, since most of the electronic components which are provided on the printed circuit board are normally connected to it. The conductor run is often also spread out as a surface over the entire printed circuit (ground surface, ground plane), in order to avoid potential differences and interference influences. The metalization of the electrical/electronic component is therefore carried out as required at least in places or on complete sections of the electrical/electronic component.

The method according to the invention for assembling an apparatus for at least partially holding at least one electrical/electronic component builds on the prior art of this generic type in that at least one electrically conductive connecting element for electrical coupling of the electrical/electronic component to at least one further electrical/electronic component which is provided outside the housing internal area is fixed by the cover. This results in the advantages explained in conjunction with the apparatus according to the invention, in the same or a similar manner, for which reason reference is made to the appropriate statements in conjunction with the apparatus according to the invention, in order to avoid repetitions.

This also applies in the same sense to the following preferred embodiments of the method according to the invention, wherein reference is also made in this context to the appropriate statements in conjunction with the apparatus according to the invention, in order to avoid repetitions.

The method according to the invention can advantageously be developed such that the cover at least partially fixes the electrically conductive connecting element by use of at least one edge section, which is coupled at least in places to at least one edge section of the housing component.

Furthermore, the method according to the invention can be implemented such that the electrically conductive connecting element is arranged between the housing component and the cover and, at least in places, touches the housing component and the cover.

Furthermore, the method according to the invention can be implemented such that the cover at least partially holds a seal, at least in the area of the fixing of the electrically conductive connecting element.

Furthermore, the method according to the invention can be carried out such that the cover holds a seal at least on an edge section which couples the cover to the housing component, such that the edge section at least partially holds the seal and fixes the electrically conductive connecting element.

In addition, the method according to the invention can be carried out such that the electrically conductive connecting element and/or the electrical/electronic component is clamped in in order to fix it between at least one edge section of the housing component and at least one edge section of the cover.

In addition, the method according to the invention can be carried out such that the housing component and/or the cover touch or touches the electrical/electronic component at least in places, such that heat produced by the electrical/electronic component is dissipated through the housing component and/or the cover.

The method according to the invention is preferably implemented such that the electrical/electronic component which is held in the housing interior is formed by a printed circuit board, in particular a rigid or fixed printed circuit board, which is clamped in by the cover.

Furthermore, the method according to the invention can preferably be developed such that the electrically conductive connecting element is formed by a flexible printed circuit, an insertion-molded stamped grid or a cable, in particular a flat ribbon cable, which is fixed by fitting the cover.

In addition, the method according to the invention can be implemented such that the electrical/electronic component is metalized, via which metalization a ground contact is produced, in particular of the electrical/electronic component to the housing component and/or the cover.

The cover according to the invention for an apparatus for at least partially holding at least one electrical/electronic component in a housing internal area builds on the prior art of this generic type in that the cover is designed such that at least one electrically conductive connecting element for electrical coupling of the electrical/electronic component to at least one further electrical/electronic component which is provided outside the housing internal area can be fixed by the cover when the cover is coupled to the housing component. In the same sense, the same or similar advantages also result in respect of the cover according to the invention, as has been explained above in conjunction with the apparatus according to the invention.

Other objects, advantages and novel features of the present invention will become apparent from the following detailed description of one or more preferred embodiments when considered in conjunction with the accompanying drawings.

BRIEF DESCRIPTION OF THE DRAWINGS

FIG. 1 is a schematic illustration of a plan view of an apparatus according to an embodiment of the invention;

FIG. 2 is a side view of the apparatus as shown in FIG. 1, taken along the section line A-A; and FIG. 3 is a further side view of the apparatus as shown in FIG. 1, taken along the section line B-B.

DETAILED DESCRIPTION OF THE DRAWINGS

FIG. 1 shows a schematic illustration of a plan view of an apparatus 10 according to an embodiment of the invention. Furthermore, FIGS. 2 and 3 show side views of the apparatus 10, as shown in FIG. 1, along the different sections A-A and B-B indicated in FIG. 1. As can be seen from FIG. 1, the apparatus 10 is used for at least partially holding at least one electrical and/or electronic component 12, in this exemplary embodiment for holding it completely, in a housing internal area, and is used in particular in commercial vehicles. In this case, the electrical and/or electronic component 12 is formed by a rigid or fixed printed circuit board 12 which holds electrical and/or electronic components, which are of no further interest, and at least partially forms a controller.

In order to hold the rigid or fixed printed circuit board 12 in the housing internal area, the apparatus 10 has a housing which is formed at least by a housing component 14, which at least partially forms the housing internal area, and a cover or cover shroud 18, which at least partially closes the housing internal area.

Furthermore, the apparatus 10 has at least one electrically conductive connecting element 16, in the present case two electrically conductive connecting elements 16, which are provided for electrical coupling of the rigid or fixed printed circuit board 12 to at least one further electrical and/or electronic component, which is provided outside the housing internal area, for example a further printed circuit board of a further controller. The electrically conductive connecting element 16 is preferably formed by a flexible printed circuit, an insert-molded stamped grid or a cable, in particular a flat ribbon cable.

The cover 18 is designed for electrically coupling the rigid or fixed printed circuit board 12 to the at least one further electrical and/or electronic component which is provided outside the housing internal area, such that the electrically conductive connecting elements 16 pass through and/or pass around the cover 18, when the cover 18 is fitted to the housing component 14, and are at the same time fixed by the cover 18. As can be seen in particular from the side view of the apparatus 10, as shown in FIG. 1, along the section A-A in FIG. 2, the electrically conductive connecting elements 16 are each fixed by an edge section of the cover 18, wherein the respective edge section of the cover 18 is coupled at least in places to a corresponding edge section of the housing component 14 or touches it.

In particular, the two electrically conductive connecting elements 16 illustrated in FIG. 1 are arranged between the corresponding edge sections of the housing component 14 and the cover 18, as can be seen in particular in FIG. 2. Because the cover 18 is fixed to the housing part 14, which in this exemplary embodiment is done by an appropriate screw connection, as shown in FIG. 1, the electrically conductive connecting elements 16 are therefore clamped in, in order to fix them, between the corresponding edge sections of the housing component 14 and the cover 18. However, in order to avoid damaging the corresponding connecting element 16, the cover 18 is designed such that it forms a predetermined intermediate space between the edge sections of the cover 18 and the housing component 14 when fitted to the housing component 14; for example, on the basis of a recess or cutout formed in the cover 18.

Furthermore, as can be seen from FIG. 2, above and below the respective electrically conductive connecting element 16, a seal 20 is provided in the cover 18 and a seal 22 is provided in the housing component; in particular the seals 20, 22 are provided at least in the area of the fixing of the respective electrically conductive connecting element 16, and are held at least partially by the cover 18 and the housing component 14. The corresponding edge sections of the cover 18 which fix the respective electrically conductive connecting element 16 are therefore used not only for fixing but, at the same time, also for sealing the housing internal area from a surrounding area.

As can be seen in particular from FIG. 3, which shows the further side view of the apparatus 10, as shown in FIG. 1, along the section B-B, the cover 18 furthermore fixes the fixed or rigid printed circuit board 12. Further edge sections of the cover 18 are provided in particular for fixing the fixed or rigid printed circuit board 12, clamping the fixed or rigid printed circuit board 12 in between an edge section of the housing component 14 and the edge section of the cover 18, thus forming a clamp 26 for the printed circuit board 12. In particular, those edge sections of the cover 18 which clamp the printed circuit board 12 may effectively be in the form of "sprung arms", as shown in the section B-B, which are designed such that one section of the corresponding sprung arm is directly coupled to the housing component, while a neighboring adjacent section of the corresponding sprung arm forms the clamp 26. In this context, a thermally conductive medium 30, in particular a thermally conductive paste, is preferably provided on the clamp 26, that is to say between the printed circuit board 12 and the housing component 14, and/or between the cover 18 and the printed circuit board 12 (not illustrated), as a result of which the contact or clamping 26 of the cover 18 to the printed circuit board 12 and/or of the housing component 14 to the printed circuit board 12 allows heat to be dissipated or carried away via the thermally conductive medium and the housing component and/or the cover 18. Furthermore, seals 24 are at least partially held in the cover 18, at least also in the areas of the clamp 26 in the outer area of the cover 18.

A method for assembling the apparatus 10 is as follows, wherein in this exemplary embodiment the apparatus is designed to completely hold the rigid or fixed printed circuit board 12 in the housing internal area. The rigid or fixed printed circuit board 12 is coupled to the corresponding electrically conductive connecting elements 16, and is arranged in the housing part 14, or vice versa. The cover 18 is then mounted on the housing component 14 via the screw connection 28, or alternatively via a comparable attachment mechanism known from the prior art, such that, on the one hand, it fixes the electrically conductive connecting element 16 or clamps the connecting element 16 in between the housing component 14 and the cover 18. On the other hand, the mounting of the cover 18 also fixes the fixed or rigid printed circuit board 12 via the clamp 26, such that, in order to fix it, it is clamped in between at least the further edge section of the housing component 14 and the further edge section of the cover 18.

TABLE OF REFERENCE NUMERALS

10 Apparatus
12 (rigid or fixed) printed circuit board
14 Housing component
16 Electrical connecting element
18 Cover or cover shroud
20 Seal
22 Seal
24 Seal
26 Clamp
28 Screw connection
30 Thermally conductive medium The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An apparatus for at least partially holding an electrical/electronic component in an internal area of a housing, comprising:
a first housing component configured to at least partially form the internal area;
a second housing component configured to at least partially close the internal area of the housing, the second housing component being configured such that at least one electrically conductive connecting element for electrically coupling the electrical/electronic component to a further electrical/electronic component provided outside of the internal area of the housing is fixed by the second housing component,
wherein the electrical/electronic component is clamped between an edge section of the first housing component and an edge section of the second housing component,
wherein the edge section of the second housing component that clamps the electrical/electronic component is formed as a sprung arm,
wherein one section of the sprung arm is directly coupled to the first housing component while a neighboring adjacent section of the sprung arm forms the clamp.

2. The apparatus according to claim 1, wherein the second housing component is a cover of the apparatus.

3. The apparatus according to claim 2, wherein the cover has an edge section configured to at least partially fix the electrically conductive connecting element, the edge section being coupled at least in places to an edge section of the first housing component.

4. The apparatus according to claim 2, wherein the cover and the first housing component are configured such that the electrically conductive connecting element is arranged therebetween and abuts the first housing component and the cover.

5. The apparatus according to claim 4, wherein the cover includes a seal at least in an area abutting the electrically conductive connecting element.

6. The apparatus according to claim 2, wherein the cover includes a seal at least on an edge section coupling the cover to the first housing component, wherein the edge section at least partially holds the seal and fixes the electrically conductive connecting element.

7. The apparatus according to claim 5, wherein the cover includes a seal at least on an edge section coupling the cover to the first housing component, wherein the edge section at least partially holds the seal and fixes the electrically conductive connecting element.

8. The apparatus according to claim 1, wherein at least one of the electrically conductive connecting element fixed by being clamped between at least one edge section of the first housing component and at least one edge section of the second housing component.

9. The apparatus according to claim 8, wherein at least one of the first housing component and the second housing component abuts the electrical/electronic component at least in places such that heat produced by the electrical/electronic component is dissipateable there through.

10. The apparatus according to claim 1, wherein the electrical/electronic component held in the housing is a printed circuit board.

11. The apparatus according to claim 1, wherein the electrically conductive connecting element is one of a flexible printed circuit, an insertion-molded stamped grid, and a cable.

12. The apparatus according to claim 11, wherein the cable is a flat ribbon cable.

13. The apparatus according to claim 1, further comprising metallization on the electrical/electronic component to provide a ground contact between the electrical/electronic component and at least one of the first housing component and the second housing component.

\* \* \* \* \*